US006897490B2

(12) United States Patent
Brunner et al.

(10) Patent No.: US 6,897,490 B2
(45) Date of Patent: May 24, 2005

(54) RADIATION EMITTING SEMICONDUCTOR COMPONENT WITH LUMINESCENT CONVERSION ELEMENT

(75) Inventors: Herbert Brunner, Regensburg (DE); Alexandra Debray, Nuremberg (DE); Harald Jäger, Pfriemd (DE); Günther Waitl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/281,263

(22) Filed: Oct. 28, 2002

(65) Prior Publication Data

US 2003/0141510 A1 Jul. 31, 2003

Related U.S. Application Data

(63) Continuation of application No. PCT/DE01/01601, filed on Apr. 26, 2001.

(30) Foreign Application Priority Data

Apr. 26, 2000 (DE) .......................................... 100 20 465

(51) Int. Cl.[7] .............................................. H01L 29/22
(52) U.S. Cl. ........................ 257/98; 257/100; 257/793
(58) Field of Search ........................ 257/98, 100, 773, 257/790, 793

(56) References Cited

U.S. PATENT DOCUMENTS 3,875,456 A    4/1975  Kano et al.
5,040,868 A    8/1991  Waitl et al.
5,177,593 A  * 1/1993  Abe .............................. 257/98
5,998,925 A   12/1999  Shimizu et al.
6,274,890 B1 * 8/2001  Oshio et al. ................... 257/98
2003/0211804 A1 * 11/2003  Sorg ............................ 445/24

FOREIGN PATENT DOCUMENTS

| DE | 298 04 149 U1 | 7/1998 |
| EP | 0 400 176 A1 | 5/1989 |
| JP | 09027643 A | 1/1997 |
| JP | 10 228249 | 8/1998 |
| JP | 10242526 A | 9/1998 |
| JP | 11 68166 | 3/1999 |
| WO | WO 97/12386 | 4/1997 |
| WO | WO 97/50132 | 12/1997 |
| WO | WO 98/12757 | 3/1998 |
| WO | WO 01/24281 A | 4/2001 |

* cited by examiner

Primary Examiner—W. David Coleman
(74) Attorney, Agent, or Firm—Cohen, Pontani, Lieberman & Pavane

(57) ABSTRACT

The invention describes a radiation-emitting semiconductor component with a luminescent conversion element, at which the semiconductor body is placed in a recess of the base body. A cup-like area is molded inside of the recess around the semiconductor body, which contains the luminescent conversion element and coats the semiconductor body. The cup-like portion is formed as indentation inside of the recess or as annular border on the base of the recess.

20 Claims, 3 Drawing Sheets a)

b)

c)

d)

e)

a)

b)

c)

d)

e)

RADIATION EMITTING SEMICONDUCTOR COMPONENT WITH LUMINESCENT CONVERSION ELEMENT

CROSS REFERENCE TO RELATED APPLICATIONS

The present application is a continuation of International Application No. PCT/DE01/01601, filed 26 Apr. 2001 which designated the United States, and claims priority to German patent application no. DE10020465.1, filed 26, Apr. 2000 both of which are incorporated herein by reference.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISK APPENDIX

Not Applicable.

BACKGROUND OF THE INVENTION

The invention generally relates to a radiation emitting semiconductor component and more particularly to a semiconductor component and method of making the same wherein the component demonstrates improved radiated multi-colored light homogeneity.

An example of light emitting semiconductor components is set out in WO 97/50132 Such components contain a semiconductor body which emits light (primary light) and a luminescent conversion element, which converts part of this light into another wavelength (fluorescence light). The complete perceived color of the emitted light from such a semiconductor component is accrued from the additive mixture of colors of primary light and fluorescent light. A luminous substance is often used as a luminescent conversion element suspended in a plastic. As shown in WO 97/50132, one structural shape of radiation emitting semiconductor components is presented where the semiconductor body is placed in a recess in the base body of the component and the recess is filled with the fluorescent suspension. This arrangement has the disadvantage that the sources of primary light—semiconductor body—and of fluorescent light—fluorescent suspension—are generally of different shapes and sizes, so that a splitting into different components of color according to the direction of beam occurs and a spatial inhomogeneous color effect is produced. Severe chromatic errors occur for optical images. That the color effect depends on the optical path length in the suspension is a further disadvantage, so that fluctuations of the thickness of the suspension layer caused by manufacturing the above semiconductor body leads to different color effects. Furthermore, a very even distribution of the luminous substance in the suspension is generally necessary.

SUMMARY OF THE INVENTION

An advantage of the present invention is to develop a radiation emitting semiconductor component of the above mentioned type which radiates homogeneous mixed-colored light. Furthermore, it is another task of the present invention to produce a manufacturing process for such components. Advantageous further formations of the invention are an object of the dependent claims.

In accordance with the present invention, the semiconductor component is configured such that semiconductor body is accommodated within and along the base of a molded recess in the component. The recess is filled with the luminescent conversion element. By this arrangement, the fluorescent light, emitted by from the recess is approximately half the total emission of the component, thereby producing a particularly even overall color effect. This is an improvement over other configurations wherein the recess accommodating the semiconductor body spans most of the semiconductor component.

In a first embodiment, the section for accommodating the luminescent conversion element is formed inside of the recess by an indentation. In a second embodiment, the section is formed by an annular border on the bottom of the recess. Casings with standard forms may also be effectively used as base bodies for both embodiments.

The side walls of the indentation and annular border is advantageously formed such that the side wall faces serve as reflectors for radiation produced within the recess and the G-value is accordingly increased.

An advantageous further formation of the invention is an embed conductor frame into the body material in a way that part of the conductor frame builds the ground area of the indentation at one of the above described form of execution or that the annular border of the other above described forms of execution is formed on the conductor frame. The semiconductor body is placed on the conductor frame at this further formation, whereby the electrical contact can be produced directly (chip bonding) or by wire bonding. The so-called conductor frame technology is used often with radiation emitting semiconductor components and can be applied with advantage at the present invention as well.

The recess can be filled with a radio parent or radiation transparent filling compound, for example a casting compound, to protect the semiconductor body and the luminescent conversion element. This filling compound preferably contains a reaction resin, for example an acrylic resin, an epoxy, a silicone resin or a mixture of these resins. A lens effect or a stray effect can be obtained by an appropriate shaping of the filling compound, which further improves the radiating characteristics of the components according to the invention or optionally modifies them. It can also be an advantage for an automatic placement machine to develop a planar surface with the composite, because such components can be picked up and positioned easier by the pick-and-place machine (pick and place method).

According to another embodiment, the luminescent conversion element comprises one or several luminous substances imbedded into a matrix. In particular, acrylic resins, epoxies and silicone resins as well as mixtures of these qualify for the matrix in regard to their miscibility, mouldability and handling. Organic compounds, including Perylene colors on the one hand or 4f metal organic compounds may be added as a luminous substance. Luminous substances like BASF lumogene F083, lumogene F240 and lumogene F300 may be added in a simple way to the epoxy. A white overall color effect may be obtained by application of inorganic luminous substances. Particularly garnets doped with rare earths as well as alkaline-earth sulphides doped with rare-earth qualify for this.

Efficient luminous substances are hereby compounds which fit the formula $A_3B_5O_{12}$:M (if they are not instable under the general conditions of preparation and working conditions), in that A marks at least one element of the group Y, Lu, Sc, La, Gd, Tb and Sm, B marks at least one element of the group Al, Ga and In, and M marks at least one element of the group Ce and Pr, preferably Ce. Particularly preferred as luminous substance are YAG:Ce ($Y_3Al_5O_{12}:Ce^{3+}$), TbYAG:Ce (($Y_xTb_{1-x})_3Al_5O_{12}:Ce^{3+}$, $0 \leq x \leq 1$), GdYAG:Ce (($Gd_xY_{1-x})_3Al_5O_{12}:Ce^{3+}$, $0<x<1$), GdTbYAG:Ce (($GdxTbyY_{1-x-y})_3Al_5O_{12}:Ce^{3+}$, $0<x<1$, $0<y<1$) as well as mixtures based on same. Al can be at least partially replaced by Ga or In hereby. Further preferred are the compounds $SrS:Ce^{3+}$, Na, $SrS:Ce^{3+}$, Cl, $SrS:CeCl_3$, $CaS:Ce^{3+}$, $SrSe:Ce^{3+}$ and $Y_3Ga_5O_{12}:Ce^{3+}$.

Thiogallate type compounds like for example $CaGa_2S_4:Ce^{3+}$ or $SrGa_2S_4:Ce^{3+}$ are suitable for the production of heterogenic mixed-colored light. The usage of aluminates doped with rare earths like for example $YAlO_3:Ce^{3+}$ and $YAl_{1-x}Ga_xO_3:Ce^{3+}$, $0 \leq x \leq 1$ and orthosilicates doped with rare earths $M'_2SiO_5:Ce^{3+}$ (M':Sc, Y, La) like for example $Y_2SiO_5:Ce^{3+}$ can be considered here as well. Yttrium can in principle be replaced by scandium or lanthanum at all yttrium compounds. The respective composition of the luminous substance is thereby determined first form the desired total color effect as well as the central wave lengths of the primary light.

Different materials are used as the matrix for the luminescent conversion element and as a filling compound in the recess at an additional particularly preferred embodiment. A material can thereby be used with advantage for the luminescent conversion element, which is optimal regarding miscibility with the luminous substance and the radiation resistance, while a material is chosen for the filling compound, which qualifies particularly because of its transparency and its mechanical endurance.

By this additional variation possibility at the selection of the filling compound and the matrix of the luminescent conversion element, further boundary conditions can be advantageously fulfilled at the formation of a radiation emitting semiconductor component with a luminescent conversion element.

Semiconductor bodies can be used with a particular advantage as components according to the invention, which emit light with a central wave length below 460 nm. The usage of such semiconductor bodies doesn't make sense at the above described components according to the state of the art, because light can damage the filling compound in this wave range, so that the filling compound rapidly ages. This disadvantage is reduced by the components according to the invention, because a part of the primary radiation is converted very closely to the semiconductor body, so that the portion of the short-wave radiation is reduced in the filling compound and the life of the component is overall prolonged.

A silicone resin is preferably used as matrix for the luminescent conversion element, which distinguishes itself by a particularly high radiation resistance in the green, blue and ultraviolet spectral region. The usage of silicone resins is particularly advantageous in connection with semiconductor bodies, which emit radiation with a wavelength below 430 nm. Radiation in this spectral region can lead to radiation damages with other resins, which clearly reduce the durability of the component. A luminescent conversion element with a silicone matrix can be combined with a filling compound based on epoxy covering the luminescent conversion element. Epoxies distinguish themselves here by high transparency and mechanical stability.

White light luminous diodes can be realized with particular advantage with components according to the invention, as they are described in the above mentioned publication WO 97/50132. Luminous substance and semiconductor bodies are matched here upon another, so that the colors of primary light and fluorescence light are complementary to one another. The effect of white light is produced by additive color mixing. The content of the publications WO 97/50132 and WO 98/12757 is incorporated herein by reference.

A multiple number of components can be assembled to bigger-sized lighting units. Such lighting units, if necessary with matrix-like arrangement of the components, distinguish themselves by high luminance and particularly homogenous total color effect.

The components according to the invention are suited with particular advantage for luminous sources in imaging lens systems. Because primary and fluorescence light is emitted from spatial closely adjacent and approximately commensurate volume, the chromatic deformations, which are produced by such a lens system, are clearly lower than at luminous sources according to the above mentioned state of the art. Furthermore, it is therefore advantageously possible to modify the radiating characteristic of a component according to the invention by one or several lenses without modification of the total color effect.

A body material with a recess is the starting point of the manufacturing process, according to the invention, for a radiation emitting semiconductor component with a luminescent conversion element, where a conductor frame is imbedded, so that a portion of the conductor frame forms the ground area of the recess. First, the conductor frame is coated over with a compound, whereby the chip service area is excluded. This recessing forms the separate area for the capture of the luminescent conversion element. Then the semiconductor body is installed on the chip service area of the conductor frame and the necessary electrical connections between semiconductor body and conductor frame for the operation are produced. In the next step, the recessed area is filled with the luminescent conversion element, whereby the semiconductor body is completely imbedded within the luminescent conversion element.

A body material with a recess is also used as the starting point in a further manufacturing method according to the invention, where a conductor frame is imbedded in such a way that part of the conductor frame forms the ground area of the recess. An annular border is modeled with a compound around the chip service area. The internal area of this border forms the separate area for the capture of the luminescent conversion element. A semiconductor body is installed inside of this border, on the chip service area of the conductor frame, and the necessary electrical connections for the operation between the semiconductor body and conductor frame are produced. In the next step, the border is filled with the luminescent conversion element, whereby the semiconductor body is completely imbedded in the luminescent conversion element.

Both methods have the advantage that standard casings and respectively basic bodies with standard casing forms can be used as starting material. The recess of the separate area for the capture of the luminescent conversion element can be easily integrated into the manufacturing process of the component according to the invention.

The recess is filled with a radio parent or radiation transparent filling compound, for example a corresponding casting compound, at an advantageous further formation of the invention. Because the casing of the semiconductor body takes two steps, delamination of the semiconductor body casing and cracking in the casing is advantageously reduced and humidity resistance, and therefore durability of the component is thereby increased.

The present invention further comprises A radiation emitting semiconductor component comprising: a base body defining an open interior recess, the recess further comprising walls defining a cup like molded portion wherein at least one semiconductor body and a luminescent conversion element are accommodated such that said luminescent conversion element defines a boundary surface between said cup like molded portion and a remainder of the open interior recess. The radiation emitting semiconductor component is further defined by the cup like portion is molded in an indentation inside the open interior recess. The radiation emitting semiconductor component is still further defined by a conductor frame is imbedded into the base body such that a portion of the conductor frame forms a floor of the indentation.

The present invention also comprises a method for producing a radiation emitting semiconductor component with a luminescent conversion element, comprising the steps of: forming a base body having a open interior recess and an imbedded conductor frame, coating the conductor frame with a compound, forming a chip service area on the conductor frame and recessing the area, forming a cup like portion on the area, the cup like portion defining an internal recess, installing a semiconductor body on the area and bonding the semiconductor body, filling the cup like portion with a luminescent conversion element such that a boundary surface of the luminescent conversion element separates the cup like portion internal recess from the open interior recess.

The present invention still further comprises a method for the production of a radiation emitting semiconductor component with a luminescent conversion element, further comprising the steps of: forming a base body having an open internal region and an imbedded conductor frame, the frame further comprising a chip service area, molding an annular border around the chip service area, the border defining a cup-like portion having an interior area, installing a semiconductor body on the chip service area and bonding the semiconductor body, and filling the interior area with a luminescent conversion element.

BRIEF DESCRIPTION OF THE SEVERAL VIEWS OF THE DRAWINGS

The novel features and method steps believed characteristic of the invention are set out in the claims below. The invention itself, however, as well as other features and advantages thereof, are best understood by reference to the detailed description, which follows, when read in conjunction with the accompanying drawing, wherein:

DETAILED DESCRIPTION OF THE PRESENT INVENTION

Figure 1:
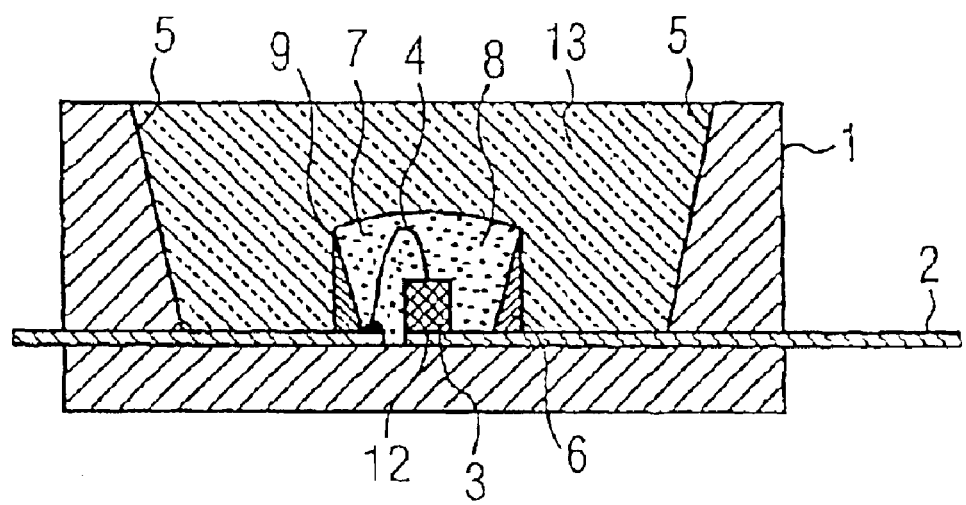
FIG. 1 depicts a schematic sectional view of a first embodiment of a radiation emitting semiconductor component according to the invention with a luminescent conversion element.

In the following disclosure, like numerals refer to like elements. The semiconductor component shown in FIG. 1, according to the invention, is a standard casing body material 1. The body may be a unibody made from a single piece of material. This can for example be an LED-casing installed on the surface which comprises thermoplast. The body or base body includes an interior recess, open internal region or groove defined by side walls 5. The side walls 5 are slightly slanted and act as a reflector for radiation produced there between. A conductor frame 2 is integrated into the body material 1, running within the base body so as to define a floor for the open internal region and specific areas described below. A semiconductor body 3 is bonded a the chip service area 12 located atop conductor frame 2. The semiconductor body is electrically connected by a wire connection 4 with the wire service area 11 of the conductor frame 2. The bonding of the semiconductor body 3 can occur as well by several wire connections according to the formation of the semiconductor body.

A smaller reflector ring is modeled and molded around the semiconductor body 3. Thermoplast may also be used, preferably, as material for this reflector ring. The reflector ring 6, defines a cup like portion and is filled with a luminescent conversion element which comprises a suspension of the luminous substance 8 in a matrix such as silicone. Silicone qualifies based on its aging stability particularly at usage with short-waved (blue, UV) emitting semiconductor bodies 3.

Masses between 0.3 mm and 0.7 mm have been shown to be particularly advantageous as the height of the reflector ring 6. Reflectors of such size guarantees a complete casing of the semiconductor body 3 with the luminescent conversion element (or simply luminescent element) 7 on the one hand, without unnecessarily increasing the volume of the luminescent conversion element 7 on the other hand. The semiconductor body emission and the luminescent conversion element may be complementary such that white light results therefrom.

It is of a particular advantage to develop the reflector ring 6 with sharp edges 9. This has the effect of the luminous suspension developing a cup or rounded head on top of the reflector ring based on its surface tension during filling of the reflector ring 6, by which the complete embedding of the semiconductor body 3 into the luminescent conversion element 7 is guaranteed. The remaining portion of the interior recess is filled with a transparent casing 13 such as epoxy. Element 7 may be different from casing 13.

Figure 2:
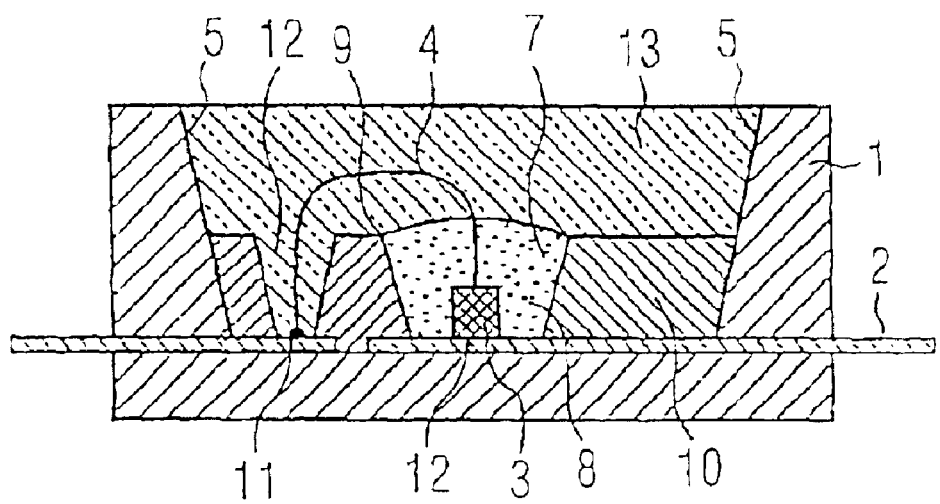
FIG. 2 depicts a schematic sectional view of a second embodiment of a radiation emitting semiconductor component according to the invention with a luminescent conversion element.

The semiconductor component depicted in FIG. 2, according to the invention, distinguishes itself from the component shown in FIG. 1 in that the area around the semiconductor body 3 for the containing of the luminescent conversion element 7 is developed by an indentation on top of the chip service area 12 of the conductor frame 2. The conductor frame 2 is covered by a thin layer of compound 10 (height preferably 0.3 mm to 0.7 mm) whereby the indentation or depression is developed by a recessing of the compound layer 10 above the chip service area 12. An execution of the recess with sharp edges 9 for the development of a cup or rounded head for the luminescent element 7 above the semiconductor body 3 can be advantageous as described above. The area recessed from the compound 10 around the semiconductor body 3 is filled with the luminescent conversion element 7.

The wire service area 11 is also recessed from the compound layer 10 in the depicted embodiment. This recessing is modeled in such a way that the lateral faces of the recesses are subsided by or opposed by the lateral faces of the casing 5. By this, it is avoided that portions of the luminous suspension, which can penetrate into the recess above the wire service area 11 during production, ascend along the casing wall 5. This ascending is further unpromoted by the roughness of the casing wall 5 and is undesired, because the radiating area of the fluorescence light is thereby increased.

Figure 3:
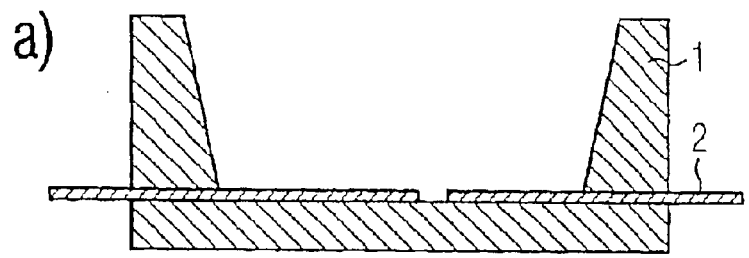
FIG. 3 depicts a schematic disclosure of a first embodiment of a manufacturing process according to the present invention.
Figure 3:
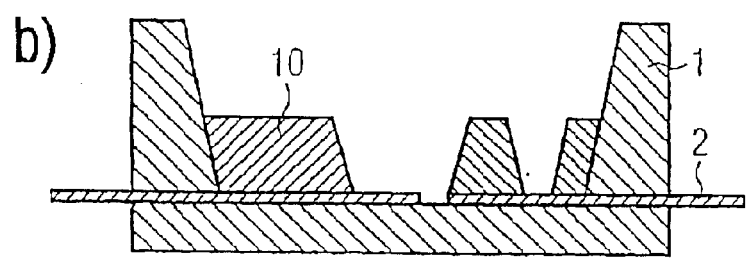
Figure 3:
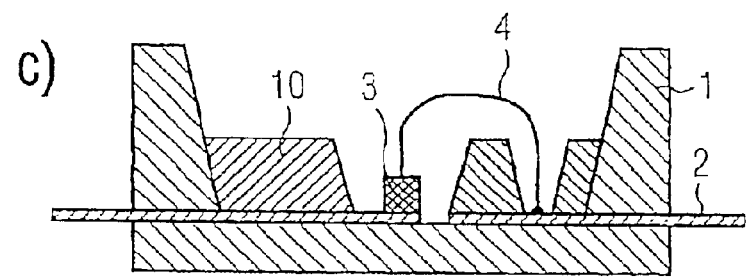
Figure 3:
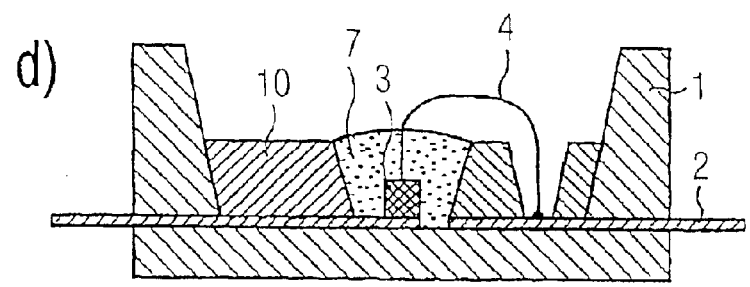
Figure 3:
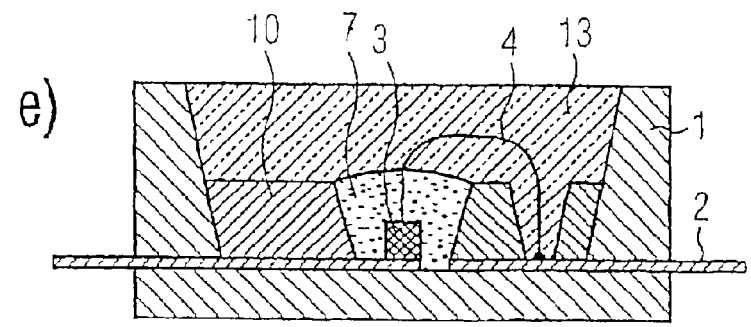

An embodiment of a manufacturing method according to the invention is schematically shown in FIG. 3. The body material 1 with the interior recess and integrated conductor frame 2 is produced in a first step, FIG. 3a, for example by extrusion-coating of the conductor fame 2 with the casing compound in an injection molding process.

The conductor frame 2 is coated over with a compound, for example PPA, in the next step, so that the conductor frame 2 is covered with a layer of compound 10 of a relatively even consistency. The chip service area 12 and the wire service area 11 of the conductor frame 2 is thereby recessed, FIG. 3b. Alternatively, the casing form shown in FIG. 3b can of course be produced in a single procedure step.

Then the semiconductor body 3 is bonded on to the chip service area 12 and the wire connection 4 between the semiconductor body 3 and the conductor frame 2 is produced, as shown in FIG. 3c. The recess around the semiconductor body 3 is filled with the luminescent conversion element 7, with for example a suspension of a luminous substance in a plastic, after completing the bonding, as shown in FIG. 3d.

Concluding, a casting 13 of the component with a radiation transparent material like, for example epoxy, can occur, FIG. 3e. The surface of the casting can be carried out planar, lenticular, napped or as diffusing disc according to the requirements of the component.

Figure 4:
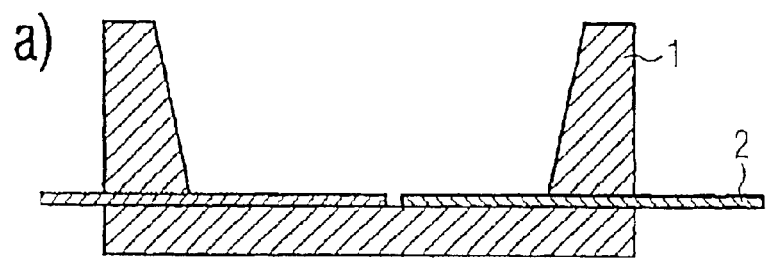
FIG. 4 depicts a schematic disclosure of a second embodiment of a manufacturing process according to the invention.
Figure 4:
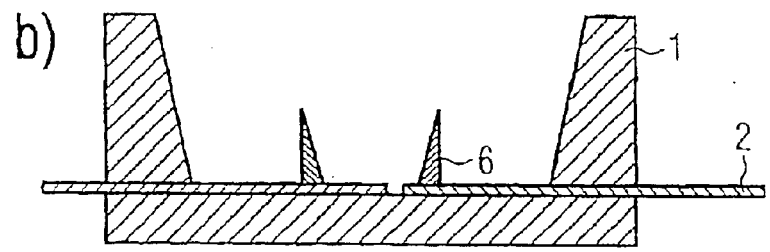
Figure 4:
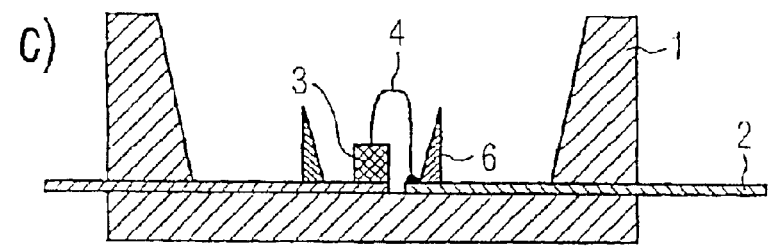
Figure 4:
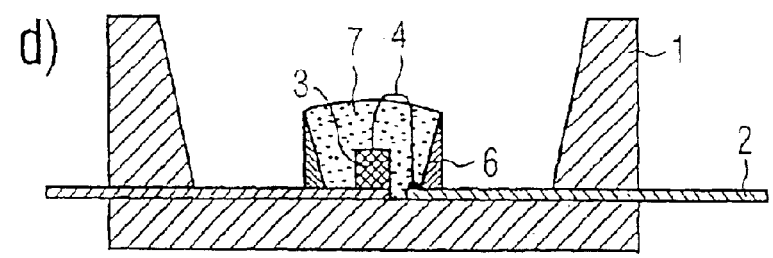
Figure 4:
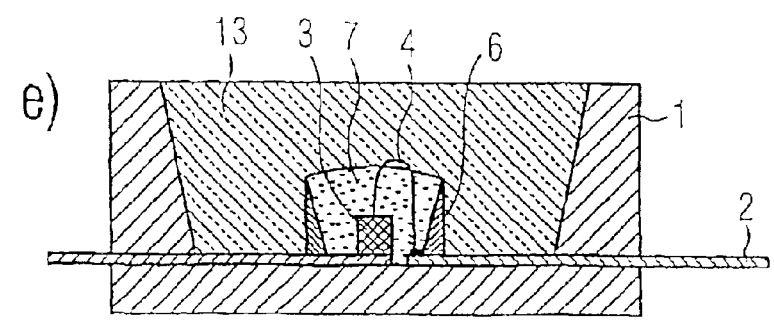

Referring to FIG. 4, a second method embodiment is depicted. Herein, the body material 1, with the recess and imbedded conductor frame 2, is produced in a first step (FIG. 4a). Afterwards, a reflector ring 6 surrounding chip service area 12, is sprayed on the conductor frame 2 (FIG. 4b). Here too the production of the base body 1 and the reflector ring 6 can occur in a single manufacturing step. The semiconductor body 3 is then installed and bonded on the chip service area 12 of the conductor frame 2 (FIG. 4c). The reflector ring 6 is, in the next step, filled with the luminescent conversion element 7 in the form of a luminous suspension, whereby a rounded head above the semiconductor body 3 is developed, based on the sharp-edged border 9 of the reflector ring 6 and the surface tension of the luminous suspension (FIG. 4d). A complete casing of the semiconductor body 3 is thereby guaranteed, without increasing unnecessarily the volume of the luminescent conversion element 7. The component can afterwards be compound-filled as in the above mentioned embodiment (FIG. 4e).

The invention being thus described, it will be obvious that the same may be varied in many ways. Such variations are not to be regarded as a departure from the spirit and scope of the invention. All obvious modifications are intended to be included within the scope of the following claims.

We claim:

1. A radiation emitting semiconductor component comprising:
    a base body defining an open interior recess, the recess further comprising walls defining a cup like molded portion wherein at least one semiconductor body and a luminescent conversion element are accommodated such that said luminescent conversion element defines a boundary surface between said cup like molded portion and a remainder of the open interior recess on top of said cup like molded portion.

2. The radiation emitting semiconductor component according to claim 1, wherein the cup like portion is molded in an indentation inside the open interior recess.

3. The radiation emitting semiconductor component according to claim 2, wherein a conductor frame is imbedded into the base body such that a portion of the conductor frame forms a floor of the indentation.

4. The radiation emitting semiconductor component according to claim 1, wherein the cup like portion is molded on a floor of the open interior recess, the cup like portion defined by an annular border.

5. The radiation emitting semiconductor component according to claim 4, wherein a conductor frame is imbedded into the base body so that a portion of the conductor frame forms a floor of the open interior recess and the annular border is molded on the conductor frame.

6. The radiation emitting semiconductor component according to claim 1, wherein the base body comprises a unibody.

7. The radiation emitting semiconductor component according to claim 1, wherein the base body is formed by a molding of duroplastic material.

8. The radiation emitting semiconductor component according to claim 2, wherein internal faces of walls defining the cup like portion are reflective.

9. The radiation emitting semiconductor component according claim 1, wherein the open interior recess is at least partially filled with a radiation transparent filling compound which verges on the luminescent conversion element.

10. The radiation emitting semiconductor component according to claim 9, wherein the filling compound comprises a reaction resin.

11. The radiation emitting semiconductor component according to claim 9, wherein the filling compound comprises at least one of an acrylic resin, an epoxy, a silicone resin and a mixture of an acrylic resin, an epoxy, and a silicone resin.

12. The radiation emitting semiconductor component according to claim 3, wherein the conductor frame comprises a chip service area and a wire service area and that the semiconductor body is installed on the chip service area and is connected with the wire service area by a wire connection.

13. The radiation emitting semiconductor component according to claim 1, wherein the luminescent conversion element comprises at least one of an organic luminous substance and an inorganic luminous substance, embedded into the matrix.

14. The radiation emitting semiconductor component according to claim 13, wherein the luminescent conversion element comprises at least one of YAG:Ce, ThYAG:Ce, GdYAG:Ce and a mixture of YAG:Ce, TbYAG:Ce, and GdYAG:Ce, wherein Al can be at least partially replaced by Ga or In.

15. The radiation emitting semiconductor component according to claim 13, wherein the matrix comprises a reaction resin.

16. The radiation emitting semiconductor component according to claim 13, wherein the matrix comprises one of an acrylic resin, epoxy, silicone resin and a mixture of acrylic resin, epoxy, and silicone resin.

17. The radiation emitting semiconductor component according to claim 13, wherein the composition of the filling of the open interior recess and the composition of the matrix of the luminescent conversion element are different.

18. The radiation emitting semiconductor component according to claim 13, wherein the open interior recess is filled with a compound containing epoxy and the matrix comprises a silicone resin.

19. The radiation emitting semiconductor component according to claim 1, wherein a central wavelength of radiation emitted by the semiconductor body is below 460 nin.

20. The radiation emitting semiconductor component according to claim 1, wherein semiconductor body emission and luminescent conversion element are complementary such that white light results therefrom.

* * * * *

UNITED STATES PATENT AND TRADEMARK OFFICE
CERTIFICATE OF CORRECTION

PATENT NO. : 6,897,490 B2  
APPLICATION NO. : 10/281263  
DATED : May 24, 2005  
INVENTOR(S) : Herbert Brunner et al.

Page 1 of 1

It is certified that error appears in the above-identified patent and that said Letters Patent is hereby corrected as shown below:

Col. 8, line 20, replace the expression "according claim 1" with -- according to claim 1 --

Col. 8, line 65, replace the expression "nin" with -- nm --

Signed and Sealed this

Sixth Day of February, 2007

JON W. DUDAS  
*Director of the United States Patent and Trademark Office*

UNITED STATES PATENT AND TRADEMARK OFFICE
CERTIFICATE OF CORRECTION

PATENT NO. : 6,897,490 B2  Page 1 of 1
APPLICATION NO. : 10/281263
DATED : May 24, 2005
INVENTOR(S) : Herbert Brunner et al.

It is certified that error appears in the above-identified patent and that said Letters Patent is hereby corrected as shown below:

Claim 9
Col. 8, line 20, replace the expression "according claim 1" with -- according to claim 1 --

Claim 20
Col. 8, line 65, replace the expression "nin" with -- nm --

Signed and Sealed this

Sixth Day of March, 2007

JON W. DUDAS
*Director of the United States Patent and Trademark Office*